United States Patent [19]
Sheu et al.

[11] Patent Number: 6,054,353
[45] Date of Patent: Apr. 25, 2000

[54] SHORT TURN AROUND TIME MASK ROM PROCESS

[75] Inventors: Shing-Ren Sheu, Tao-Yuan; Cheng-Chih Kung, Hsin-Chu, both of Taiwan

[73] Assignee: United Microelectronics Corporation, Taiwan

[21] Appl. No.: 08/746,855

[22] Filed: Nov. 18, 1996

Related U.S. Application Data

[60] Provisional application No. 60/013,934, Mar. 22, 1996.

[51] Int. Cl.$^7$ ................................................ H01L 21/8234
[52] U.S. Cl. ............................................ 438/275; 438/276
[58] Field of Search ...................... 438/275–279

[56] References Cited

U.S. PATENT DOCUMENTS

| | | | |
|---|---|---|---|
| 4,811,066 | 3/1989 | Pfiester et al. | 357/23.5 |
| 5,358,887 | 10/1994 | Hong | 437/48 |
| 5,681,772 | 10/1997 | Chen et al. | 437/45 |

*Primary Examiner*—Joni Chang
*Attorney, Agent, or Firm*—Rabin & Champagne, P.C.

[57] ABSTRACT

A mask ROM stores information by selecting the work function of the gates of each FET in an array of FETs at a late stage in the manufacture of the ROM. The polysilicon gates of some of the FETs are doped N-type and the gates of the other FETs are doped P-type to form gates having different work functions, thereby forming FETs having different threshold voltages. The ROM consists of a parallel array of buried N$^+$ bit lines formed in the substrate, a gate oxide layer deposited over the bit lines and a layer of polysilicon deposited on the gate oxide. The polysilicon is blanket doped N-type, gate electrodes are defined by photolithography, and then self-aligned silicide layers are formed on the gate electrodes. An insulating layer is then formed over the gate electrodes. Programming of the ROM is accomplished by forming a mask on the insulating layer and then implanting ions through openings in the mask, through the insulating layer and the silicide layer, and into the polysilicon layer. The implantation converts individual gate electrodes from N-type to P-type to alter the threshold voltage of the selected transistors. Relatively few additional processing steps are needed after the programming to complete the ROM.

20 Claims, 3 Drawing Sheets

SHORT TURN AROUND TIME MASK ROM PROCESS

This application claims priority from provisional application Ser. No. 60/013,934, filed Mar. 22, 1996.

BACKGROUND OF THE INVENTION

1. Field of the Invention

The present invention relates to the storage of information by altering the operational characteristics of a transistor within an array of memory transistors and, more particularly, to a non-volatile memory such as a read only memory (ROM).

2. Description of the Related Art

Conventional read only memories (ROMs) consist of an array of field effect transistors, with each memory cell including a single field effect device. Each of the field effect transistors can be formed so as to have one of two predetermined values of a particular characteristic of the transistor. The selectable transistor characteristic might, for example, be the threshold voltage of the transistor. Implanting impurities into the channel region of the transistor might cause the transistor to have a low threshold voltage so that the transistor is turned on by application of $V_{CC}$ to the gate of the transistor. Transistors formed without implanting impurities into the channel might have a high threshold voltage and the transistor is not turned on by application of $V_{CC}$ to the gate of the transistor. Alternately, transistors formed without implanting impurities into the channel region may have a low threshold voltage, and transistors having implanted channel regions may have high threshold voltages. Binary data can then be stored in the memory by selectively implanting impurities into the channels of the transistors, with transistors having impurities implanted into the channel region storing a logical zero and transistors having no impurities implanted into the channel region storing a logical one. Of course, the opposite assignment of logical values is also known.

There is a constant need to provide non-volatile memories which can be rapidly programmed to provide quick turn around time memories for a variety of applications. ROMs programmed by implanting impurities into the channel of memory transistors are programmed early in the manufacturing process and must undergo a number of further processing steps before the ROM is ready to be shipped. Such ROMs have undesirably long turn around times. Non-volatile memories such as flash memories can be programmed after all processing is done on the device and so have short turn around times. Flash memories, however, are unacceptably expensive in comparison to mask ROMs. It is thus desirable to provide an inexpensive non-volatile memory having a shorter turn around time.

Recent memory designs are near the limits of semiconductor processing technology in that further reductions in the size of devices in memories will require significant improvements in processing technology. For example, programming ROMs by the selective implantation of impurities into the channels of transistors relies on a careful mask alignment to define the implantation mask. For 0.5 μm design rules, such as are implemented in some current memory designs, alignment of the implantation mask is a time consuming and error prone process which increases the cost of the ROM and undesirably reduces yield. Device design considerations also limit the extent to which the information storage density of conventional ROMs can be increased. For example, conventional ROMs contact the source and drain regions of a row of transistors using buried $N^+$ lines. For reduced design rules in which these lines are made smaller, the resistance of these buried $N^+$ lines inevitably increases because it is not possible to adopt higher doping levels without increasing dopant diffusion into the channel regions and into adjacent device regions. As the resistance of the buried $N^+$ lines increases, the RC time constant of the lines increases and increases the time required to read information out of the ROM.

Accordingly, it is desirable to provide an inexpensive non-volatile memory compatible with reduced dimension design rules that is readily manufacturable and which provides improved memory storage density.

SUMMARY OF THE PREFERRED EMBODIMENTS

An aspect of the present invention provides a method of programming a mask ROM comprising forming an encoding mask on an insulating layer formed over a structure consisting of memory transistors each having a gate, wherein the encoding mask provides a plurality of openings corresponding to possible memory locations within the mask ROM. Programming is accomplished by implanting impurities through the openings in the encoding mask and through the insulating layer into the gates of the memory transistors and then removing the encoding mask.

A more specific aspect of this invention includes steps of blanket doping a layer of polysilicon with a first dopant of a first conductivity type, wherein the step of programming locally alters the polysilicon to a second conductivity type by adding to the polysilicon layer second dopants of the second conductivity type.

Another aspect of the present invention provides a method of programming a mask ROM by providing a substrate covered with a gate oxide and an array of memory transistors each having a gate electrode formed on the gate oxide, each of the gate electrodes having a layer of polysilicon adjacent the substrate and a layer of conductive material formed over the layer of polysilicon. Impurities are implanted into select ones of the gate electrodes into the layer of polysilicon through the layer of conductive material.

DETAILED DESCRIPTION OF THE PREFERRED EMBODIMENTS

An aspect of the present invention provides a mask ROM in which information is encoded by selectively programming the level of the threshold voltage of each transistor in an array of transistors to one of two or more predetermined levels at a late stage in the manufacturing process. In particularly preferred embodiments of the present invention, ROM programming is performed after the deposition of an insulation layer over completed transistors and wiring lines. Programming the ROM at this late stage in the manufacturing process provides a much improved turn around time for preferred embodiments of the present invention as compared to conventional ROM programming strategies.

Preferred embodiments of the present invention program memory transistors by selectively implanting ions into the gate electrodes of the transistors, selecting the work function of the gate electrodes and thereby setting the threshold voltage of the transistors. As described below, particularly preferred embodiments of the present invention provide gate electrodes of either P-type polysilicon or N-type polysilicon to form memory transistors having either relatively high or low threshold voltages. This programming may be simply accomplished. For example, polysilicon gate material may be blanket implanted with one conductivity type dopant when the memory transistors are formed. Processing continues to complete the transistors and wiring lines. A layer of metal or metal silicide is provided over all of the gate electrodes. An insulating layer is formed over the device and the ROM can be stored until ready for programming. When the ROM is to be programmed, a mask is formed over the insulating layer having openings provided in accordance with the desired programming. Dopants of the second conductivity type are implanted through openings in the mask and the insulating layer, through the metal or metal silicide layer and into the polysilicon gate electrode to locally dope regions of the gate electrodes to the second conductivity type. The metal or metal silicide layers overlying the gate electrodes ensure conduction along the gate electrodes despite the formation of P/N junctions along the gate electrode lines.

Figure 8:
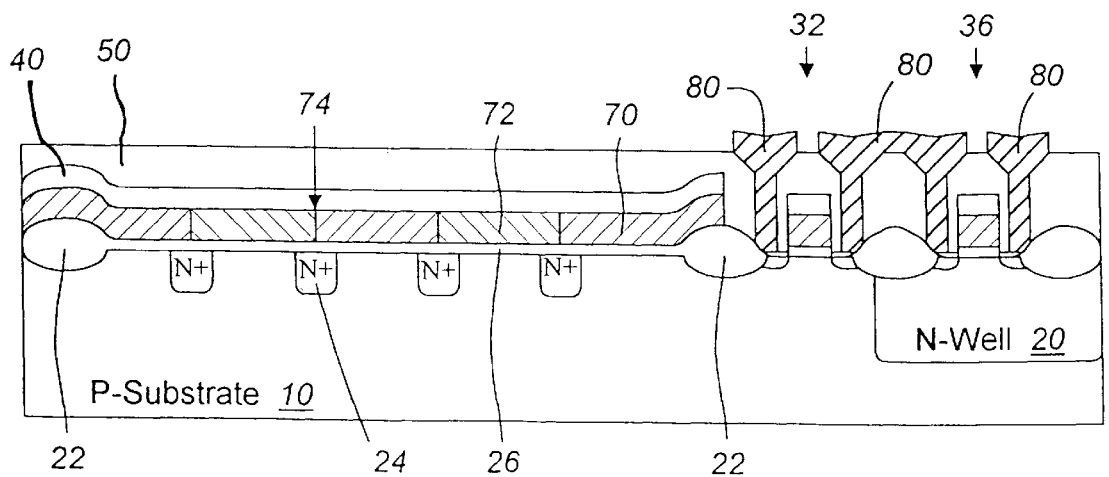

A ROM encoded by selective doping of a polysilicon gate electrode is briefly described with reference to FIG. 8, which shows a ROM in accordance with the present invention at a late stage of processing. The FIG. 8 ROM is formed on a P-type substrate 10 having an array of buried N+ bit lines 24 formed within the cell region of the ROM and N-well regions 20 formed as required in the peripheral circuitry sections of the ROM. Field oxide regions 22 or other isolation structures are formed to define the cell region of the ROM and as necessary to provide isolation between the devices within the peripheral circuitry of the ROM. Gate oxide 26 covers the channel regions of the memory transistors and the buried N+ bit lines 24. N-type polysilicon lines 70 are formed on the gate oxide 26 as gate electrodes for some of the memory transistors and P-type polysilicon lines 72 are formed as gate electrodes for the other memory transistors. The threshold voltage of the memory transistors having N-type polysilicon gates 70 may be approximately 0.9–1.0 V, and the threshold voltage of the memory transistors having P-type polysilicon gates 72 may be approximately 1.9 V. A threshold voltage difference of approximately one volt may be readily obtained using conventional doping levels for forming P-type or N-type polysilicon. The difference in programming states can be detected either by sensing the impedance of the memory transistor or by sensing which transistors turn on upon the application of a reference voltage of an appropriate level to the gates of the memory transistors. The latter method is facilitated when the FIG. 8 ROM is formed using design rules of less than one half micron, in which operating voltages are desirably chosen to be low, and might be approximately 1.5 V.

P/N junctions 74 are formed at the interface between the N-type and P-type portions of the polysilicon gate electrode lines, which makes the gate electrodes non-conductive. Accordingly, a layer of conductive material 40 which makes ohmic contact to both N-type and P-type polysilicon overlies the N-type polysilicon gate electrodes 70 and the P-type polysilicon gate electrodes 72. The layered structure of N-type and P-type polysilicon and conductive material 40 allows the gate electrodes of the memory transistors to be used as word lines in the manner typical for ROMs. Peripheral circuitry typically includes both NMOS transistors 32 and PMOS transistors 36 which may be coupled to form inverters and buffer circuitry.

ROMs in accordance with preferred aspects of the present invention can be manufactured and programmed late in the manufacturing cycle in a manner that is inexpensive and sufficiently reproducible to allow well controlled definition of the different threshold voltage states. A uniformly thin gate oxide 26 is formed over the array of buried N+ bit lines 24 and then a polysilicon layer 28 is deposited over the gate oxide. The polysilicon layer is uniformly doped to one conductivity type (e.g., N-type) and the polysilicon layer is etched to define the gate electrodes which conventionally serve as word lines for the ROM. Then, a layer of a metal or a silicide of a metal is formed over the polysilicon lines, preferably using a self-aligned silicide process. An insulating layer is formed over the ROM, preferably enclosing the integrated circuit in such a way that it can be left in atmosphere without degrading the integrated circuit. No programming of the ROM has been performed at this late stage in the manufacturing process. When the ROM is to be programmed, an encoding mask is formed over the insulating layer of the ROM and ions are implanted through the openings in the mask, through the insulating layer and the metal or metal silicide layer, and into the polysilicon gate electrode to locally dope portions of the gate electrode. In this way, preferred embodiments convert the conductivity type of gate electrodes of selected transistors from N-type to P-type, increasing the threshold voltage of the selected transistors to store, for example, a logical one. Little further processing is necessary to complete the ROM so that aspects of the present invention provide quick turn around time ROMs. Encoding ROMs in this manner provides more forgiving tolerances than conventional programming methods, including channel implantation techniques. Moreover, because fewer dopants are provided to the substrate, there is less diffusion and fewer of the many problems associated with the unwanted diffusion of impurities within the substrate.

Figure 1:
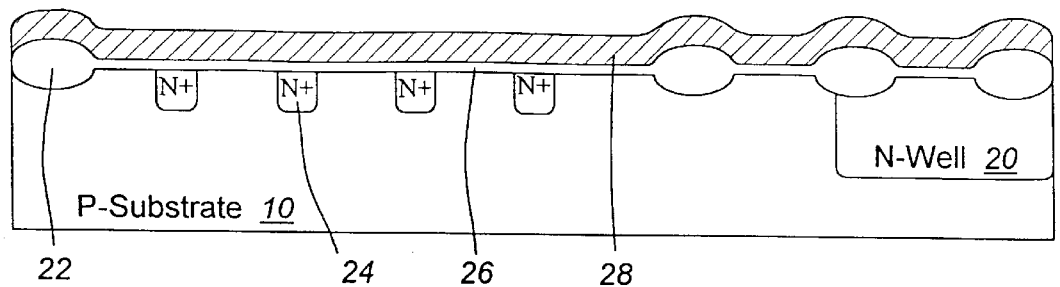
FIGS. 1–8 are partial cross-sectional views of a mask ROM in accordance with the present invention at different stages in the manufacture of the mask ROM.

A method for producing a mask ROM in accordance with the present invention will now be described with reference to FIGS. 1–8. Referring first to FIG. 1, a P-type substrate 10 is prepared by forming an N-well region 20 and field oxidations 22 for the PMOS and NMOS peripheral circuitry of the ROM. A parallel array of buried N+ regions 24 is formed which serve both as bit lines for the ROM and as source and drain regions for the FETs of the ROM. Next, a thin gate oxide layer 26 is formed over the entire device by thermal oxidation process in an oxygen ($O_2$) ambient at a temperature of about 900° C., forming a gate oxide layer 26 approximately 135 Å thick. Preferably, this thin oxide layer is also formed over the channel regions of the transistors in peripheral circuitry sections (shown on the right of FIG. 8). A layer of polysilicon 28 is deposited over the gate oxide layer 26 to a thickness of, for example, 1000–4000 Å and more preferably about 3000 Å. The layer of polysilicon may be deposited by, for example, low pressure chemical vapor deposition from silane source gas at a temperature of about 620° C., as is well known in the art.

Preferably, the selective definition of N-type and P-type polysilicon gate electrodes is made late in the manufacturing process using a single mask. This may be accomplished by first uniformly doping the entire polysilicon layer, using diffusion or blanket ion implantation, to a first conductivity type. Processing continues to nearly complete the ROM device, preferably including patterning to define gate electrodes, forming salicide (self-aligned silicide) structures on the gate electrodes, and depositing an insulating layer over the device. Then, at a late stage of the manufacturing process, a mask is formed with openings above the regions of the polysilicon where material of one conductivity type is to be converted to material of the opposite conductivity type. Dopants of the opposite conductivity type are then selectively implanted into the polysilicon to convert select polysilicon gate electrodes to the opposite conductivity type. Preferably, this implantation is made through the insulating layer and through the layer of conductive material covering the gate electrodes. Referring again to FIG. 1, the polysilicon layer 28 may be subjected to a blanket implantation of arsenic (As) to a dosage of about $4 \times 10^{15}$ atoms/cm$^2$ with an energy of about 80 KeV. The polysilicon layer 28 is thus doped to a uniform N-type level. The amount of impurity implanted is preferably sufficient to produce a transistor having a threshold voltage value sufficiently different from the other threshold voltage values that can be programmed to allow the programmed data to be written and read with reliability.

Figure 2:
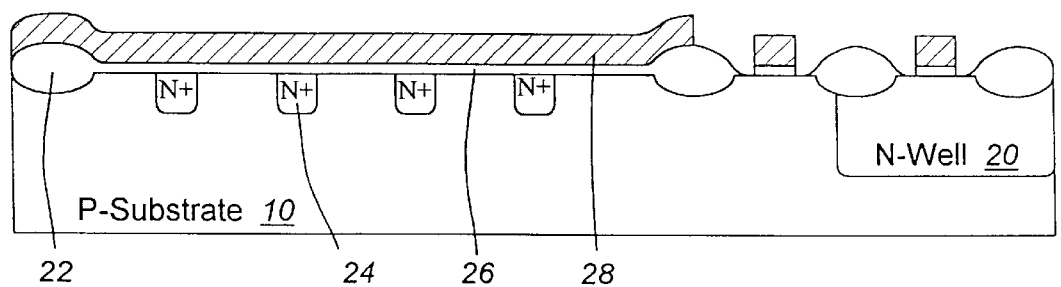
Figure 3:
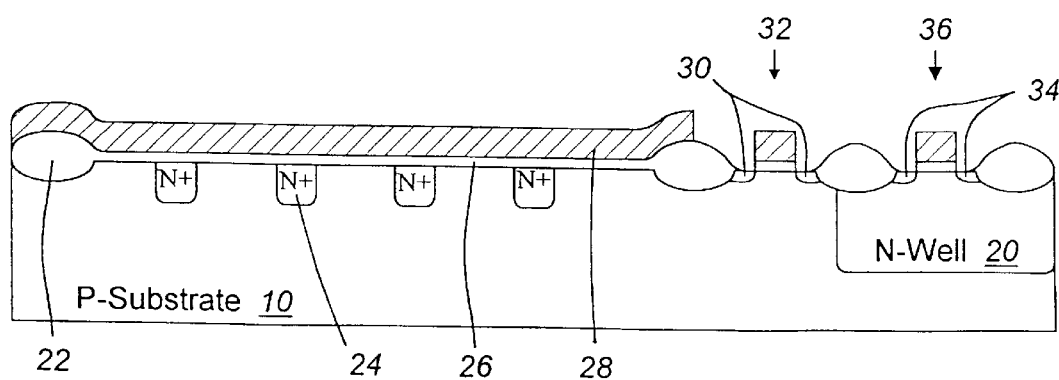
Figure 4:
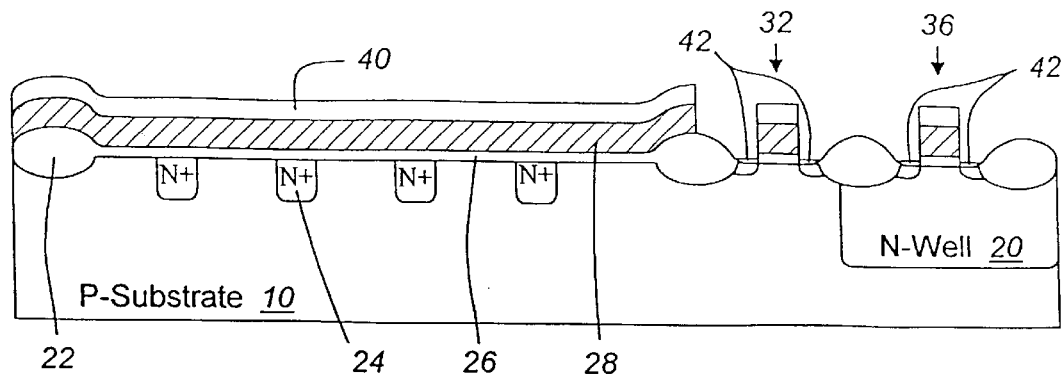
Figure 5:
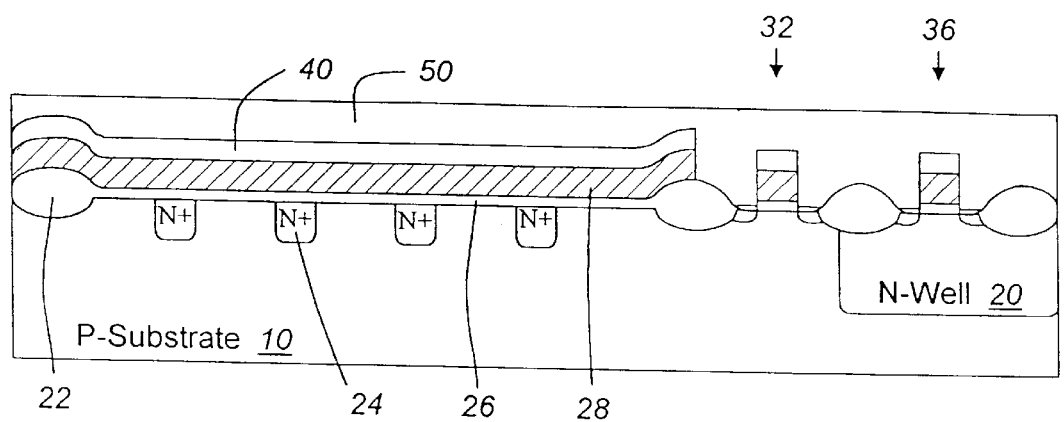
Figure 6:
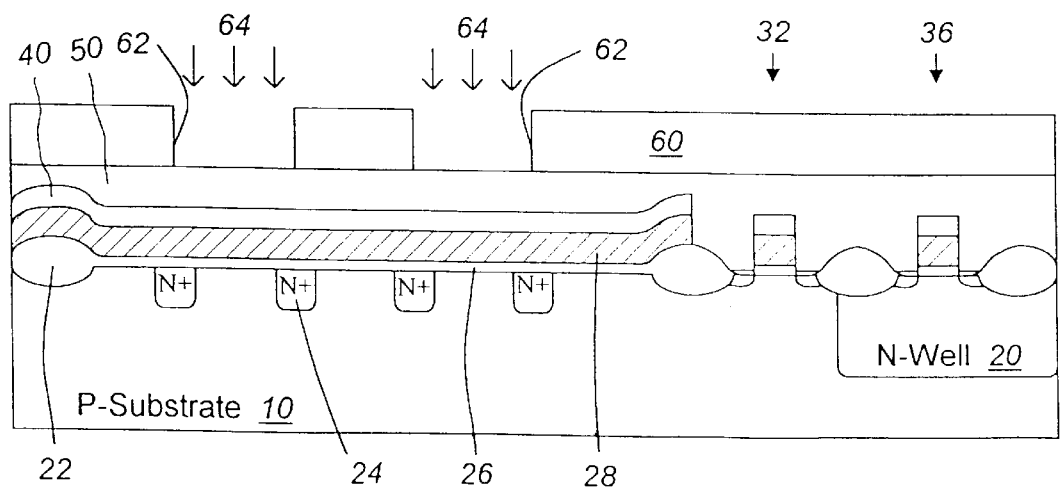

After the blanket implantation, a layer of photoresist is deposited over the polysilicon layer 28 and photolithographic patterning and etching are performed to define the N-type polysilicon gate electrodes for the ROM. Preferably, this photolithography step is also used to define the gate electrodes for the peripheral circuits, as shown in FIG. 2. Referring now to FIG. 3, LDD (lightly doped drain) source and drain regions for the peripheral circuits are preferably formed by conventional ion implantation techniques. The peripheral circuitry includes buffers and sense amplifiers incorporating both NMOS devices 32 and PMOS devices 36. N-type LDD source/drain regions 30 are formed for the NMOS devices 32 and P-type LDD source/drain regions 34 are preferably formed for the PMOS devices 36.

Because portions of the polysilicon gate electrodes 28 will be doped N-type and others will be doped P-type, P/N junctions will be formed along the gate electrodes in preferred embodiments of the present device. As such, it is preferred to provide an additional conductive layer overlying the gate electrodes to provide a continuous conduction path along the entire length of the gate electrodes. Preferably, the additional conductive layer is formed of a material that readily forms ohmic contacts to either N-type or P-type polysilicon. Appropriate materials include refractory metals, other metals and metals suicides. Self-aligned silicides formed from materials such as titanium, cobalt, nickel, platinum and palladium are particularly preferred. For example, a layer of titanium silicide may be formed by first sputtering a layer of titanium over the surface of the device, including over the gate electrodes to a thickness of, for example, 500 Å. This titanium layer is converted into titanium silicide at the surface of the polysilicon gate electrodes 28 and at the exposed portions of the substrate, including the source/drain regions 30, 34, in a two step process. In the first process step, the device is subjected to a rapid thermal anneal (RTA) by heating the device to a temperature of up to about 700° C. for ten seconds, converting the titanium layer into titanium silicide (nominally $TiSi_2$) where the titanium layer is in contact with a silicon (crystalline or polycrystalline) surface. The device is then etched using a wet etch consisting of $H_2O_2$ and $NH_4OH$ diluted in water, removing unreacted titanium from the surface of the device, exposing the oxide regions of the device. Layers of titanium silicide 40 (FIG. 4, in exaggerated proportion) are left over the polysilicon gate electrodes 28 and titanium silicide regions 42 are formed over the source/drain regions 30, 34. Such titanium silicide regions 42 provide lower sheet resistance over the source/drain regions and provide better contacts to the source/drain regions 30, 34. Titanium silicide contacts on the source/drain regions are thus preferred so long as the amount of silicon consumed in the silicidation process does not result in excessive junction leakage at the source/drain regions.

After the unreacted titanium is etched from the device, further processing is necessary to provide suitable self-aligned silicide (salicide) structures for the gate electrodes and wiring lines of the device. The process steps described to this point form a relatively high resistivity phase of titanium silicide on the silicon surfaces, so that the illustrated salicide structure does not have as low of resistivity as is desirable. It is accordingly necessary to expose the device to a second rapid thermal anneal at a temperature in excess of 800° C. for at least ten seconds to convert the titanium silicide on the surface of the salicide to the lower resistivity phase of titanium silicide.

A salicide layer 40 of between about 200–800 Å is typically formed over the polysilicon gate electrodes 28. Next, referring to FIG. 5, an insulating layer 50 of boron-phosphorus TEOS (BPTEOS) or ozone TEOS (TEOS-$O_3$) is formed over the ROM at a substrate temperature of about 700° C. to a depth of approximately 4500 Å. Most preferably, the insulating layer 50 provides a planarized surface over the ROM. At this stage, the ROM has not been specialized or programmed in any way and the ROM has been enclosed in a way that allows further processing to be postponed. Programming preferably occurs by ion implantation through the insulating layer 50, through the salicide structure 40, and into the polysilicon layer 28. A photoresist mask 60 is formed over the insulating layer 50 having openings 62 aligned over the gate electrodes of the memory transistors that are to be programmed to a different threshold value than the default value corresponding to an N-type polysilicon gate electrode to which the unprogrammed transistors have been set. Most preferably, programming consists of a boron ions 64 implanted at a high energy of about 280 KeV to a dosage of approximately $6 \times 10^{15}$ ions/cm$^2$. The photoresist mask 60 is then removed and the heavy boron implantation is annealed at a temperature of about 900° C. in a nitrogen ($N_2$) ambient. This annealing step also causes the insulating layer 50 to reflow.

Figure 7:
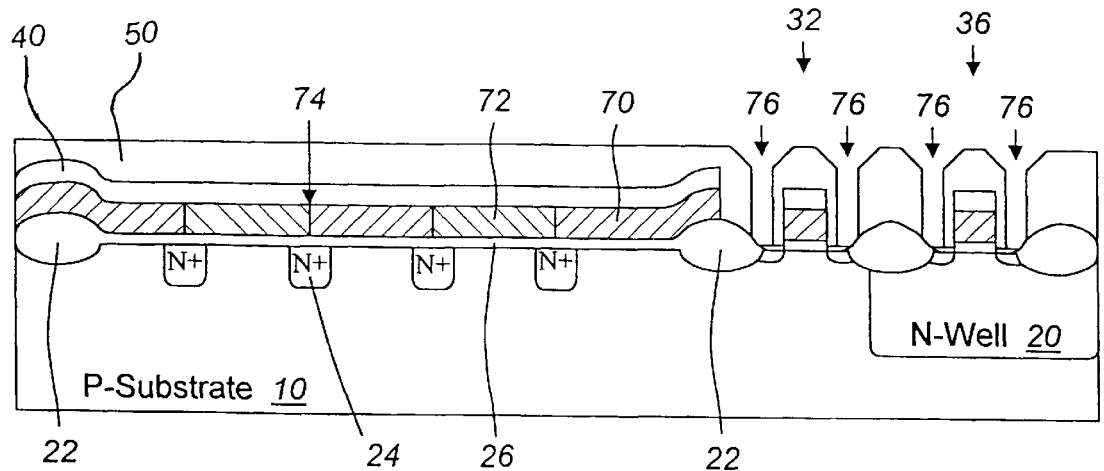

As is shown in FIG. 7, the polysilicon layer includes local regions of N-type doped polysilicon 70 and local regions of P-type doped polysilicon 72. P/N junctions 74 are formed between the adjacent P-type and N-type regions in the polysilicon layer so that little or no conduction proceeds along the polysilicon layer of the polysilicon gate electrodes. Thus, the layer of salicide 40, or another layer of conductive material, is most preferred for the ROM to be used in the conventional manner with the gate electrodes operating as the word lines of the ROM.

Contact vias 76 are opened to the source/drain regions and other contact points within the peripheral circuits of the ROM. As shown in FIG. 8, metal contacts 80 formed from for example, aluminum, are formed in the conventional manner and other conventional processing continues to complete the ROM. These relatively few processing steps after programming can be completed quickly, allowing a rapid turn around time for preferred embodiments of the invention.

Although the present invention has been described in terms of certain preferred embodiments, the description of particular embodiments is not intended to limit the scope of the present invention. Rather, the scope of the present invention is represented by the following claims.

What is claimed is:

1. A method of programming a mask ROM, comprising:
providing an unprogrammed ROM structure, comprising
a substrate,
a gate oxide layer disposed over the substrate,
a continuous polysilicon layer that is doped to a first conductivity-type and disposed over the gate oxide layer,
a continuous layer of conductive material disposed directly on the polysilicon layer, and
an insulating layer covering the layer of conductive material;
forming a mask layer over the insulating layer, wherein the mask layer includes openings exposing portions of the insulating layer; and
implanting impurities into the polysilicon layer through the openings in the mask layer, and through the underlying insulating layer and layer of conductive material, such that portions of the polysilicon layer disposed below the openings in the mask layer are doped to a second conductivity-type.

2. The method of claim 1, wherein the impurities comprise boron.

3. The method of claim 1, wherein the conductive material forms an ohmic contact with both P-type polysilicon and N-type polysilicon.

4. The method of claim 3, wherein the conductive material comprises a metal or a metal silicide.

5. The method of claim 1, wherein the unprogrammed ROM structure includes an array of memory transistors, wherein at least some of adjacent ones of the memory transistors physically abut each other.

6. The method of claim 5, wherein the insulating layer covers all of the memory transistors of the array.

7. The method of claim 5, wherein programming the mask ROM includes simultaneously programming all of the memory transistors of the array disposed under openings in the encoding mask.

8. The method of claim 1, wherein each said gate of the memory transistors is programmed to one of only two threshold levels.

9. The method of claim 1, wherein the portions of the polysilicon layer that are doped to the second conductivity-type by the selective implanting, and contiguous portions of the polysilicon layer that remain doped to the first conductivity-type, have p-n junctions formed therebetween.

10. The method of claim 1, further comprising storing the unprogrammed ROM structure before the implanting, until programming of the mask ROM is required.

11. The method of claim 1, wherein contiguous portions of the continuous polysilicon layer form gate electrodes after selectively implanting impurities is performed.

12. A method of programming a mask ROM, comprising:
providing an unprogrammed ROM structure, comprising
a substrate,
a gate oxide layer disposed over the substrate,
a continuous polysilicon layer that is doped to a first conductivity-type and disposed over the gate oxide layer, and
a continuous layer of conductive material disposed directly on the polysilicon layer; and
selectively implanting impurities into portions of the polysilicon layer through the layer of conductive material, such that the portions of the polysilicon layer subjected to the selective implanting are doped to a second conductivity-type.

13. The method of claim 12, wherein the layer of conductive material is a metal silicide.

14. The method of claim 12, wherein the unprogrammed ROM structure includes a layer of oxide covering the layer of conductive material, and the implanting takes place through the layer of oxide.

15. The method of claim 12, wherein the impurities comprise boron.

16. The method of claim 15, wherein the impurities are implanted at an energy of greater than 200 KeV.

17. The method of claim 12, wherein the unprogrammed ROM structure includes an array of memory transistors, wherein at least some of adjacent ones of the memory transistors of the array physically abut each other.

18. The method of claim 12, wherein contiguous portions of the continuous polysilicon layer form gate electrodes after selectively implanting impurities is performed.

19. The method of claim 18, wherein selectively implanting impurities into portions of the polysilicon layer includes simultaneously implanting impurities into all portions of the polysilicon layer that are selected to be gate electrodes of a first type.

20. The method of claim 18, wherein selectively implanting impurities into portions of the polysilicon layer programs the resulting gate electrodes to one of only two threshold levels.

* * * * *